US011965942B2

(12) United States Patent
Cheng et al.

(10) Patent No.: US 11,965,942 B2
(45) Date of Patent: Apr. 23, 2024

(54) MEASUREMENT METHOD FOR B-H CURVE OF MAGNETIC MATERIAL BASED ON MAGNETIC-INDUCTANCE

(71) Applicant: SOUTHEAST UNIVERSITY, Jiangsu (CN)

(72) Inventors: Ming Cheng, Jiangsu (CN); Xinkai Zhu, Jiangsu (CN); Wei Qin, Jiangsu (CN); Zheng Wang, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 233 days.

(21) Appl. No.: 17/613,847

(22) PCT Filed: Jan. 22, 2021

(86) PCT No.: PCT/CN2021/073266
§ 371 (c)(1),
(2) Date: Nov. 23, 2021

(87) PCT Pub. No.: WO2022/110526
PCT Pub. Date: Jun. 2, 2022

(65) Prior Publication Data
US 2022/0342014 A1 Oct. 27, 2022

(30) Foreign Application Priority Data
Nov. 26, 2020 (CN) .......................... 202011350288.7

(51) Int. Cl.
*G01R 33/12* (2006.01)
(52) U.S. Cl.
CPC .............................. *G01R 33/1253* (2013.01)
(58) Field of Classification Search
CPC ................ G01R 33/1253; G01R 33/00; G01R 33/0035; G01R 33/0023; G01R 33/0017;
(Continued)

(56) References Cited

U.S. PATENT DOCUMENTS 5,265,611 A * 11/1993 Hoenig .................. A61B 5/242
324/262
2014/0265580 A1* 9/2014 Cooley ................ H02K 7/1853
290/1 A

FOREIGN PATENT DOCUMENTS

CN 103197267 A 7/2013
CN 104198966 A 12/2014
(Continued)

OTHER PUBLICATIONS

Yu Zhang et al., "Magnetic Core Losses Measurement Instrumentations and a Dynamic Hysteresis Loss Model" 2009 IEEE Electrical Power & Energy Conference, Oct. 23, 2009, 5 pages.

*Primary Examiner* — Jermele M Hollington
*Assistant Examiner* — Taqi R Nasir
(74) *Attorney, Agent, or Firm* — Muncy, Geissler, Olds & Lowe, P.C.

(57) ABSTRACT

A measurement apparatus includes an Epstein frame, an alternating power supply, a power analyzer, and an oscilloscope. Electromagnetic coupling modeling on an Epstein frame is performed based on a vector model of a magnetic circuit, where an iron core of the Epstein frame is formed by laminating a silicon steel sheet to be measured, and an excitation coil and a detection coil with the same turns number are wound around the iron core. The measurement process is to first obtain a reference B-H curve that only considers a nonlinear reluctance of the iron core, and then to derive a B-H curve considering an eddy current effect in a magnetic field at any frequency from the reference B-H curve. The method, applicable to a measurement for B-H curves at middle and high frequencies, may obtain much higher accuracy.

5 Claims, 5 Drawing Sheets

(58) Field of Classification Search
CPC .... G01R 31/3191; G01B 7/004; G01C 17/38; G06F 3/017; G06F 3/0346; G06F 3/012
See application file for complete search history.

(56) References Cited

FOREIGN PATENT DOCUMENTS

| | | | |
|---|---|---|---|
| CN | 105425178 | A | 3/2016 |
| CN | 105929347 | A | 9/2016 |
| CN | 106326595 | A | 1/2017 |
| CN | 106908745 | A | 6/2017 |
| CN | 110399677 | A | 11/2019 |
| CN | 111190128 | A | 5/2020 |
| JP | 52146674 | A | 12/1977 |
| JP | 2018146337 | A | 9/2018 |
| KR | 20130098766 | A | 9/2013 |
| WO | WO-2005106720 | A2 | 11/2005 |

\* cited by examiner

MEASUREMENT METHOD FOR B-H CURVE OF MAGNETIC MATERIAL BASED ON MAGNETIC-INDUCTANCE

TECHNICAL FIELD

The present invention relates to the field of electric engineering, and particularly to a measurement method for a B-H curve of magnetic material.

BACKGROUND

The finite element analysis (FEA) method is usually applied to design and analyze electromagnetic apparatus. In order to obtain the FEA results that can meet the real electromagnetic situation as much as possible, an appropriate solution domain and a proper boundary condition are necessary, and the accurate simulation of real characteristics of the materials are also critical. The silicon steel sheet is often used in the electromagnetic apparatus, and has such characteristics as nonlinearity, magnetic hysteresis, and electric conduction. In the conventional electromagnetic field finite element calculation, the B-H curve is only used to stimulate the nonlinear characteristic of the silicon steel sheet. However, the magnetic hysteresis characteristic and the eddy current characteristic of the silicon steel sheet are usually ignored, leading to that the direct current magnetic biasing and eddy current reaction on an external magnetic field are not considered. Therefore, the FEA results sometimes deviate from the real electromagnetic situation. In particular, in some electromagnetic apparatuses which work at middle and high frequencies, the effect of the eddy current is quite obvious, hence, the result errors without considering the eddy current effect are relatively larger. Therefore, the accurate measurement method and simulation method on the characteristics of the magnetic material are still the current research hot spot.

There are many researches about the measurement and simulation of the silicon steel sheet. Tekgun Burak et al. of the University of Akron, USA, measured iron loss and the B-H curve of the silicon steel sheet in the presence of both oversaturation and direct current magnetic biasing. A. J. Bergqvist of the KTH Royal Institute of Technology, Sweden, put forward a vector JA model to describe the magnetic hysteresis characteristic of the silicon steel sheet in the case of rotational magnetization. Leite J. V. et al. in Brazil developed a simulation model of a starting process of a self-excited induction generator based on the vector JA model, which can simulate the effects of magnetic hysteresis and the eddy current effect of the silicon steel sheet on the output characteristic of a motor. Zhu Sa et al. of Southeast University, China, used a method of combining polynomial extrapolation with saturation magnetization strength to simulate the B-H curve in the saturation region of the silicon steel sheet, thereby obtaining a relatively good calculation result. However, there are few studies on the measurement and simulation method for B-H curves of the silicon steel sheet at different frequencies. To obtain B-H curves at different frequencies, the measurement needs to be performed sequentially frequency by frequency, which is time-consuming and requires special high-frequency experimental equipments.

SUMMARY

The technical problem to be solved in the present invention is to provide a measurement and simulation method for deriving a B-H curve at any frequency by only measuring a B-H curve at a certain frequency. The method can achieve much higher accuracy when applied to the measurement of B-H curves at middle and high frequencies.

The present invention provides a measurement method for a B-H curve of magnetic material, where electromagnetic coupling modeling is performed on an Epstein frame based on a vector model of a magnetic circuit, an iron core of the Epstein frame is formed by laminating a silicon steel sheet to be measured, and an excitation coil and a detection coil with the same turns number are wound around the iron core, the measurement method including:

(1) a measurement process of a reference B-H curve:

S1, a voltage $\dot{U}_E$ with a reference frequency f is applied to the excitation coil, generating an exciting current $\dot{I}_E$, then an induced voltage $\dot{U}_D$ is generated on the detection coil, and a magnetic flux $\dot{\Phi}$ in the iron core of the Epstein frame can be derived as $\dot{\Phi}=\dot{U}_D/(2\pi f N_2)$, wherein $N_2$ is the turns number of the detection coil;

S2, active power fed to the excitation coil is measured by a power analyzer with copper loss of the excitation coil being removed, then a magnetic-inductance $L_{mc}$ can be obtained according to a relationship of $P=\omega^2 L_{mc}\|\dot{\Phi}\|^2$ between the active power and the magnetic-inductance, wherein $\omega$ is an angular frequency of a magnetic flux varied in the magnetic circuit;

S3, a maximum value of the exciting current $\dot{I}_E$ is measured corresponding to each induced voltage $\dot{U}_D$ by using an oscilloscope to obtain a magnetomotive force (MMF) $\dot{F}$ and the magnetic flux $\dot{\Phi}$ of the magnetic circuit of the iron core of the Epstein frame, then a magnetic impedance $\dot{Z}_{mc}$ of the whole iron core can be derived, and next, a reluctance $R_{mc}$ of the iron core under the action of the exciting current $\dot{I}_E$ can be derived based on a formula $\|\dot{Z}_{mc}\|=\sqrt{R_{mc}^2+(\omega L_{mc})^2}$ and the magnetic-inductance $L_{mc}$;

S4, a magnetic flux density $\dot{B}$ of the iron core can be derived from the magnetic flux $\dot{\Phi}$ and a cross-sectional area S of the iron core, then a magnetic permeability $\mu$ of the iron core can be obtained by a formula $R_{mc}=L/(\mu S)$, and next a magnetic field strength $\dot{H}$ corresponding to the magnetic flux density $\dot{B}$ can be obtained, wherein l is an average length of the magnetic circuit of the iron core; and the exciting voltage $\dot{U}_E$ is adjusted and the measurement process is repeated to obtain a reference B-H curve which only considers the nonlinear reluctance of the iron core.

(2) a B-H curve considering an eddy current effect at any frequency of magnetic field can be derived from the reference B-H curve, wherein the specific process is as follows:

a reluctance $R_{mc}$ can be obtained from the reference B-H curve when any magnetic flux density $\|\dot{B}\|$ is known, the magnetic impedance $\dot{Z}_{mc}$ of the magnetic circuit can be obtained under the condition that the magnetic-inductance $L_{mc}$ is known corresponding to an eddy current reaction at any frequency, then the MMF $\dot{F}$ can be derived in this case by $\dot{F}=\dot{Z}_{mc}\cdot\dot{\Phi}$, next the magnetic field strength $\dot{H}$ can be obtained by $\dot{H}=\dot{F}/l$, and the B-H curve considering the eddy current effect can be drawn.

Further, in the proposed measurement method, values of the magnetic-inductance $L_{mc}$ at different frequencies $f_1$ and $f_2$ satisfy a relationship equation $$\frac{L_{mc\_1}}{L_{mc\_2}} = \sqrt{\frac{f_2}{f_1}},$$

and according to the relationship equation, the value of the magnetic-inductance $L_{mc}$ at any frequency can be obtained by the magnetic-inductance $L_{mc}$ at the reference frequency.

Further, in the proposed measurement method, the magnetic-inductance $L_{mc}$ is equivalent to a lumped parameter representing the eddy current reaction in the iron core of the Epstein frame, the reluctance $R_{mc}$ is equivalent to a lumped parameter representing a nonlinear action of the iron core, and the vector model of the magnetic circuit of the iron core is $\dot{F}=(R_{mc}+j\omega L_{mc})\dot{\Phi}$, where j represents an imaginary unit.

Further, in the proposed measurement method, virtual magnetic power $\dot{S}_{mc}$ based on the vector model of the magnetic circuit is obtained based on the MMF $\dot{F}$ and the magnetic flux $\dot{\Phi}$, as follows:

$$\dot{S}_{mc}=\dot{\Phi}\cdot\dot{F}^*=\dot{\Phi}\cdot[R_{mc}\cdot\dot{\Phi}^*-j\omega L_{mc}\dot{\Phi}^*]=R_{mc}\|\dot{\Phi}\|^2-j\omega L_{mc}\|\dot{\Phi}\|^2.$$

Further, in the proposed measurement method, the virtual magnetic power $\dot{S}_{mc}$ and electric power $\dot{S}_e$ are in a convertible relationship of $\dot{S}_e=j\omega \dot{S}_{mc}=\omega^2 L_{mc}\|\dot{\Phi}\|^2+j\omega R_{mc}\|\dot{\Phi}\|^2$, where the real part is the active power input by using the excitation coil, and the imaginary part is reactive power input by using the excitation coil.

Compared with the prior art, the foregoing technical solutions used in the present invention have the following beneficial effects.

The present invention considers an effect of the eddy current reaction on measurement of the B-H curve, which not only may exclude the effect of the eddy current reaction to obtain a reference B-H curve that is only used to describe the nonlinear characteristic of the magnetic material, but also may obtain a family of B-H curves including the eddy current reaction at any frequency by using the B-H curve that includes the eddy current reaction at the reference frequency. Moreover, the present invention may simplify the measurement process of the B-H curve to save measurement time and reduce requirement for a measurement apparatus. The proposed measurement has more obvious beneficial effects on the measurement of the B-H curves at middle and high frequencies.

DETAILED DESCRIPTION

Figure 1:
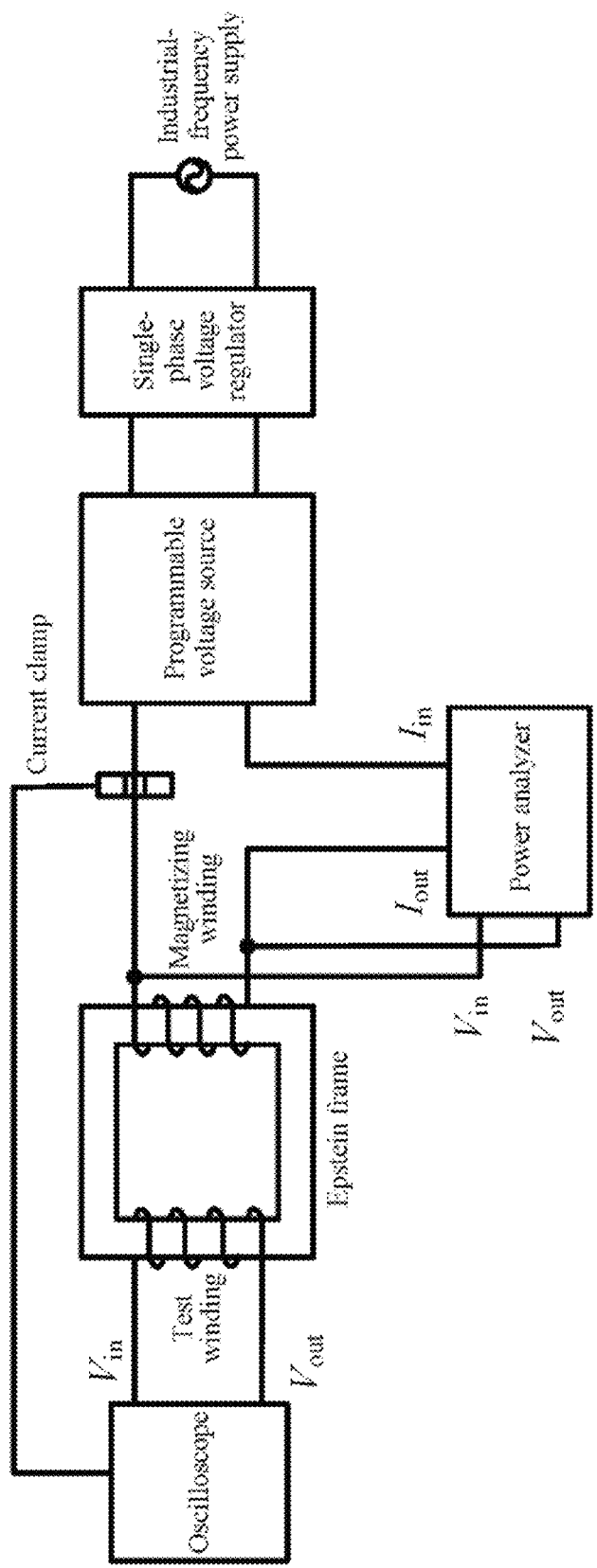
FIG. 1 is a schematic diagram of a measurement platform of a B-H curve of magnetic material of the present invention.

Technical solutions of the present invention are further described in detail below with reference to accompanying drawings.

The present invention provides a measurement method for a B-H curve of magnetic material. A measurement apparatus includes an Epstein frame, an alternating power supply, a power analyzer, and an oscilloscope. The core content of the present invention is to perform electromagnetic coupling modeling on an Epstein frame based on a vector model of a magnetic circuit. An iron core of the Epstein frame is formed by laminating a silicon steel sheet to be measured, and an excitation coil and a detection coil with the same turns number are wound around the iron core.

The vector model of the magnetic circuit includes three "magnetic components": an MMF $\dot{F}$, a reluctance $R_{mc}$, and a magnetic-inductance $L_{mc}$. Interaction of the three magnetic components may represent a magnetic flux $\Phi$ that flows in a magnetic circuit, where the MMF and the magnetic flux are vectors, a specific relationship is $\dot{F}=\dot{\Phi}\cdot(R_{mc}+j\omega L_{mc})$, and an angle between the MMF and the magnetic flux is $$\theta = \arctan\left(\frac{\omega L_{mc}}{R_{mc}}\right).$$

Virtual magnetic power $\dot{S}_{mc}$ in the magnetic circuit may be calculated by using the MMF and the magnetic flux, which is expressed as $\dot{S}_{mc}=\dot{\Phi}\cdot\dot{F}^*=\dot{\Phi}\cdot[R_{mc}\cdot\dot{\Phi}^*-j\omega L_{mc}\dot{\Phi}^*]=R_{mc}\|\dot{\Phi}\|^2-j\omega L_{mc}\|\dot{\Phi}\|^2$. According to the law of conservation of energy and the electromagnetic energy conversion relationship, the virtual magnetic power $\dot{S}_{mc}$ in the magnetic circuit is obtained by converting electric power $\dot{S}_e$ input by the excitation coil. Two forms of power satisfy a relationship $\dot{S}_e=j\omega \dot{S}_{mc}=\omega^2 L_{mc}\|\dot{\Phi}\|^2+j\omega R_{mc}\|\dot{\Phi}\|^2$, where the real part represents the active power in an electric circuit represented by parameters of the magnetic circuit, and the imaginary part represents the reactive power in the electric circuit represented by the parameters of the magnetic circuit.

The magnetic-inductance $L_{mc}$ in the vector model of the magnetic circuit of the Epstein frame represents a reaction of the eddy current of an iron core. The magnetic-inductance is related to the resistance R of the iron core and the frequency f of the magnetic flux, but unrelated to the magnitude of the magnetic flux.

Furthermore, the magnetic-inductance $L_{mc}$ may change the magnitude and the phase of the magnetic flux. The magnitude of the effect of the magnetic-inductance on the change of the magnetic flux may be represented by a magnetic reactance $\dot{X}_{mc}$, $\dot{X}_{mc}=j\omega L_{mc}$.

The reluctance $R_{mc}$ in the vector model of the magnetic circuit of the Epstein frame represents nonlinearity of the iron core, which is related to a saturation degree of the magnetic flux. The reluctance $R_{mc}$ may change the magnitude of the magnetic flux, but does not change the phase thereof.

Furthermore, the magnetic flux in the Epstein frame is determined jointly by the magnetic-inductance $L_{mc}$ and the reluctance $R_{mc}$, that is, determined jointly by the reaction of the eddy current of the iron core and the nonlinearity of the iron core. The combined effect of the magnetic-inductance $L_{mc}$ and the reluctance $R_{mc}$ is referred to as the magnetic impedance which is represented as $\dot{Z}_{mc}$. The magnetic impedance is a vector, the magnitude of the magnetic impedance is $\|\dot{Z}_{mc}\|=\sqrt{R_{mc}^2+(\omega L_{mc})^2}$, and a relationship among the magnetic impedance, the MMF, and the magnetic flux is $\dot{F}=\dot{Z}_{mc}\cdot\dot{\Phi}$.

Furthermore, a relationship between the virtual magnetic power $\dot{S}_{mc}$ and the electric power $\dot{S}_e$ may be explained as follows: Power consumed by the magnetic-inductance in the magnetic circuit is obtained by dividing the active power input by the excitation coil by $\omega$, and power consumed by the reluctance in the magnetic circuit is obtained by dividing the reactive power input by the excitation coil by $\omega$; and the power consumed by the magnetic-inductance in the magnetic circuit is power consumed by the eddy current of the iron core, and the power consumed by the reluctance is power stored by the iron core.

Based on the vector model of the magnetic circuit, the specific process of measuring the B-H curve is as follows:

A voltage $\dot{U}_E$ with a reference frequency f is applied to the excitation coil to generate an exciting current $\dot{I}_E$ and generate an induced voltage $\dot{U}_D$ on the detection coil. The magnetic flux $\dot{\Phi}$ in the iron core of the Epstein frame may be represented as $\dot{\Phi}=\dot{U}_D/(2\pi fN_2)$, where $N_2$ is the turns number of the detection coil. Active power fed to an excitation coil is measured by using a power analyzer (with copper loss of the excitation coil being removed), and a magnetic-inductance $L_{mc}$ is obtained according to a relationship $P=\omega^2 L_{mc}\|\dot{\Phi}\|^2$ between the active power and the magnetic-inductance. A maximum value of the exciting current $\dot{I}_E$ corresponding to each induced voltage $\dot{U}_D$ is observed by using an oscilloscope to obtain the MMF $\dot{F}$ and the magnetic flux $\dot{\Phi}$ of the magnetic circuit in the iron core of the Epstein frame and then a magnetic impedance $\dot{Z}_{mc}$ of the whole iron core is obtained. The reluctance $R_{mc}$ of the iron core under the action of the exciting current $\dot{I}_E$ is obtained based on $\|\dot{Z}_{mc}\|=\sqrt{R_{mc}^2+(\omega L_{mc})^2}$ of the magnetic impedance and the known magnetic-inductance $L_{mc}$. The magnetic flux density $\dot{B}$ of the iron core is obtained by dividing the known magnetic flux $\dot{\Phi}$ by a cross-sectional area S of the iron core. A magnetic permeability μ of the iron core is obtained by a formula $R_{mc}=l/(\mu S)$ of the reluctance $R_{mc}$, and then a magnetic field strength $\dot{H}$ corresponding to the magnetic flux density $\dot{B}$ is obtained, where l is an average length of the magnetic circuit of the iron core. An exciting voltage $\dot{U}_E$ is adjusted and the measurement process is repeated to obtain a reference B-H curve, where the reference B-H curve is a B-H curve only considering a nonlinear reluctance of the iron core.

A B-H curve, considering the eddy current effect in a magnetic field at any frequency, may be derived from the reference B-H curve. A specific process is as follows: The reluctance $R_{mc}$ may be obtained on the reference B-H curve in a case that any magnetic flux density value $\|\dot{B}\|$ is known, and the magnetic impedance $\dot{Z}_{mc}$ of the magnetic circuit may be obtained in a case that the magnetic-inductance $L_{mc}$ corresponding to the eddy current reaction at the frequency is known, then an MMF $\dot{F}$ is obtained in this case by using $\dot{F}=\dot{Z}_{mc}\cdot\dot{\Phi}$, then a magnetic field strength $\dot{H}$ is obtained, $\dot{H}=\dot{F}/l$, and the B-H curve considering the eddy current effect is obtained.

The magnetic-inductance $L_{mc}$ is related to the resistance R of the iron core. Because of the skin effect, the resistance changes with a frequency of a magnetic field, and the magnetic-inductance also changes accordingly.

Furthermore, values of the magnetic-inductance $L_{mc}$ at different frequencies $f_1$ and $f_2$ satisfy a relationship $$\frac{L_{mc\_1}}{L_{mc\_2}} = \sqrt{\frac{f_2}{f_1}},$$

hence, the value of the magnetic-inductance at any frequency may be obtained by the magnetic-inductance $L_{mc}$ at the reference frequency. A B-H curve, considering an eddy current effect at any frequency, may be derived from the B-H curve considering the eddy current effect at the reference frequency.

Figure 2:
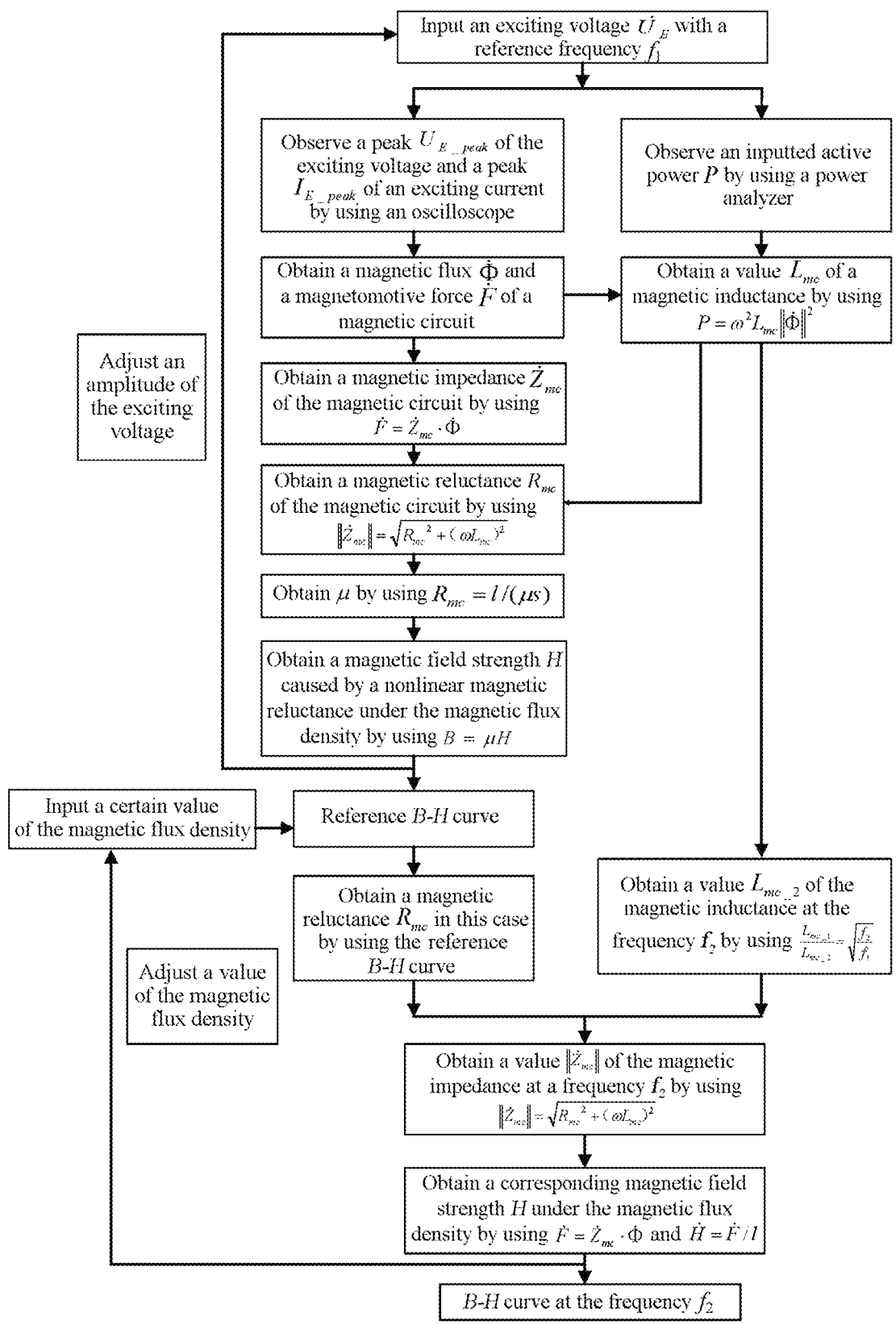
FIG. 2 is a flowchart of a measurement of a B-H curve of magnetic material of the present invention.

A measurement platform of a B-H curve of magnetic material shown in FIG. 1 mainly includes a programmable alternating power supply, an Epstein frame, a power analyzer, and an oscilloscope. A B-H curve with a 400 Hz reference frequency is measured based on the platform. A B-H curve with a 200 Hz frequency and a B-H curve with an 800 Hz frequency are derived on this basis. A flowchart thereof is shown in FIG. 2.

First, a 400 Hz exciting voltage $\dot{U}_E$ is applied to the excitation coil by using the alternating power supply. The exciting voltage $\dot{U}_E$ is adjusted to control a magnetic field strength. A peak $U_{E\_peak}$ of the exciting voltage and a peak $I_{E\_peak}$ of the exciting current are observed by using the oscilloscope. Active power P input to an electric circuit (copper loss of the excitation coil is removed) is observed by using the power analyzer.

The value of the magnetic flux $\|\dot{\Phi}\|$ the magnetic circuit of the iron core is derived by using the peak $U_{E\_peak}$ of the exciting voltage. The value $\|\dot{F}\|$ of the MMF obtained by using the peak of the exciting current.

By using a relationship $P=\omega^2 L_{mc\|\dot{\Phi}\|}^2$ between the active power P of the electric circuit and the magnetic flux $\|\dot{\Phi}\|$, the value $L_{mc}$ of the magnetic-inductance of the eddy current of the iron core at a 400 Hz frequency is obtained.

By using a relationship $\dot{F}=\dot{Z}_{mc}\cdot\dot{\Phi}$ between the MMF and a magnetic flux, the value of the magnetic impedance $\|\dot{Z}_{mc}\|$ of the magnetic circuit is obtained, and then the value of the reluctance $R_{mc}$ of the magnetic circuit is obtained according to $\|\dot{Z}_{mc}\|=\sqrt{R_{mc}^2+(\omega L_{mc})^2}$.

Magnetic permeabilities of the iron core at different magnetic fluxes may be obtained by a $R_{mc}=l/(\mu s)$. The magnetic field strengths H at different magnetic flux density values B may be obtained according to a relationship $B=\mu H$.

Figure 3:
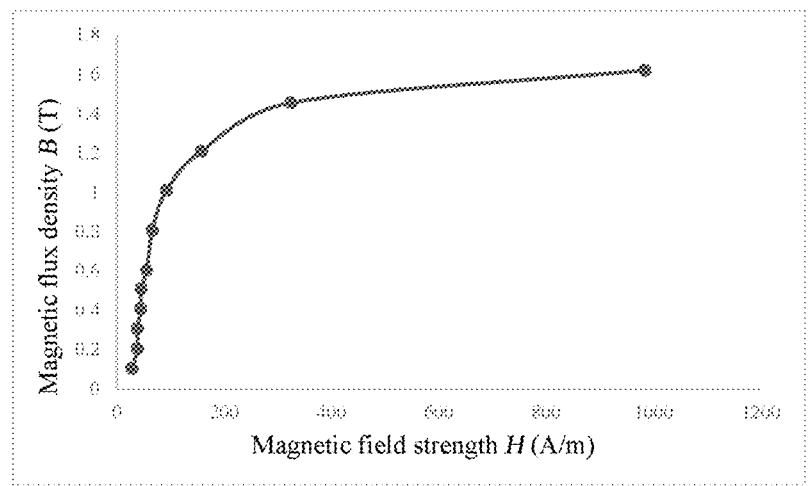
FIG. 3 is a reference B-H curve which excludes the eddy current effect and is measured by applying the present invention.

The exciting voltage $\dot{U}_E$ is adjusted and the foregoing steps are repeated to obtain a plurality of groups of (B, H) data, and draw out a reference B-H curve excluding the eddy current effect at a 400 Hz reference frequency, as shown in FIG. 3.

Figure 4:
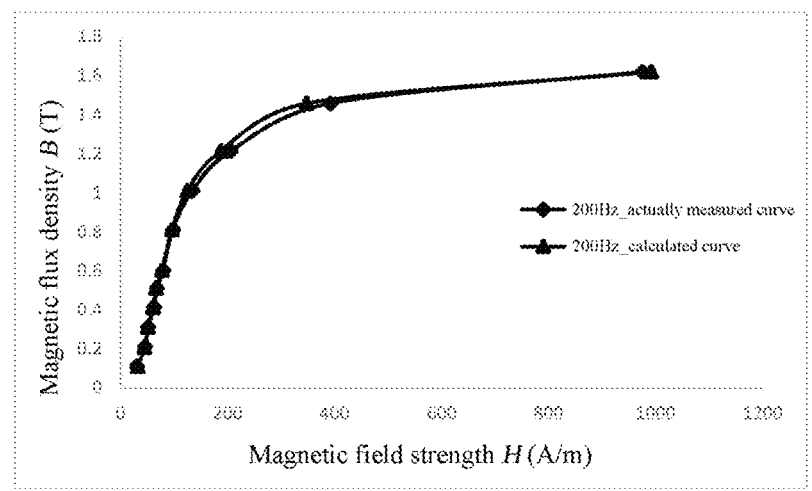
FIG. 4 is a comparison diagram of a 200 Hz B-H curve derived by applying the present invention and an actually measured curve.
Figure 5:
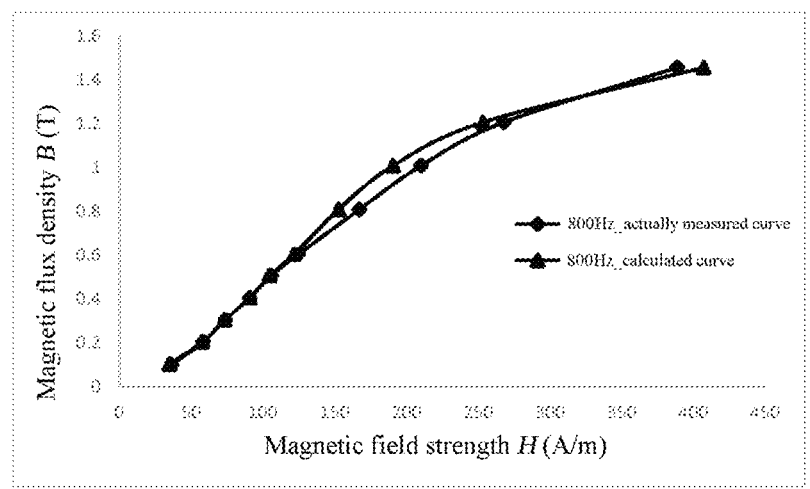
FIG. 5 is a comparison diagram of an 800 Hz B-H curve derived by applying the present invention and an actually measured curve.

Since the values of the magnetic-inductance at different frequencies satisfy the relationship $$\frac{L_{mc\_1}}{L_{mc\_2}} = \sqrt{\frac{f_2}{f_1}},$$

the values of the magnetic-inductance at 200 Hz and 800 Hz may be obtained by using the value $L_{mc\_400}$ of the magnetic-inductance at 400 Hz, and are respectively written as $L_{mc\_200}$ and $L_{mc\_800}$. By using the reference B-H curve, a corresponding value of the reluctance $R_{mc}$ at a certain magnetic flux density B is obtained. By using the reluctance and the magnetic-inductance, values of the magnetic impedance at the frequencies 200 Hz and 800 Hz are obtained by using $\|\dot{Z}_{mc}\|=\sqrt{R_{mc}^2+(\omega L_{mc})^2}$, then values $\|\dot{F}\|$ of the MMF generating the magnetic flux density at the frequencies 200 Hz and 800 Hz may be obtained, magnetic field strengths H may be further obtained by using $\dot{H}=\dot{F}/l$, and finally B-H curves at the frequencies 200 Hz and 800 Hz may be obtained. FIG. 4 and FIG. 5 compare the B-H curves derived at the frequencies 200 Hz and 800 Hz and the actually measured B-H curve respectively.

In general, the present invention provides a measurement method for a B-H curve based on a vector model of a magnetic circuit. If there is a need to obtain a B-H curve at a certain high frequency, a specific high-frequency power supply is not necessary any more. Therefore, difficulty of measuring the high-frequency B-H curve may be reduced, and a new idea is provided for characteristic simulation of the silicon steel sheet considering the eddy current reaction.

The foregoing descriptions are only exemplary implementations of the present invention. The protection scope of the present invention is not limited to the foregoing implementations. Any equivalent modification or variation made according to the disclosure of the present invention by a person of ordinary skill in the art all should fall within the protection scope of the claims.

What is claimed is:

1. A measurement method for a magnetic flux density (B) magnetic field intensity (H) curve of magnetic material, wherein electromagnetic coupling modeling is performed on an Epstein frame based on a vector model of a magnetic circuit, an iron core of the Epstein frame is formed by laminating a silicon steel sheet to be measured, and an excitation coil and a detection coil with the same turns number are wound around the iron core, the measurement method comprising:

(1) a measurement process of a reference B-H curve:

S1, a voltage $\dot{U}_E$ with a reference frequency $f_1$ is applied to the excitation coil, generating an exciting current $\dot{I}_E$, then an induced voltage $\dot{U}_D$ is generated on the detection coil, and a magnetic flux $\dot{\Phi}$ in the iron core of the Epstein frame can be derived as $\dot{\Phi}=\dot{U}_D/(2\pi f_1 N_2)$, wherein $N_2$ is the turns number of the detection coil;

S2, active power P fed to the excitation coil is measured by a power analyzer with copper loss of the excitation coil being removed, then a magnetic-inductance $L_{mc}$ can be obtained according to a relationship of $P=\omega^2 L_{mc}\|\dot{\Phi}\|^2$ between the active power and the magnetic-inductance, wherein $\omega$ is an angular frequency of a magnetic flux varied in the magnetic circuit;

S3, a maximum value of the exciting current $\dot{I}_E$ is measured corresponding to each induced voltage $\dot{U}_D$ by using an oscilloscope to obtain a magnetomotive force (MMF) $\dot{F}$ and the magnetic flux $\dot{\Phi}$ of the magnetic circuit of the iron core of the Epstein frame, then a magnetic impedance $\dot{Z}_{mc}$ of the whole iron core can be derived, and next, a reluctance $R_{mc}$ of the iron core under the action of the exciting current $\dot{I}_E$ can be derived based on a formula $\|\dot{Z}_{mc}\|=\sqrt{R_{mc}^2+(\omega L_{mc})^2}$ and the magnetic-inductance $L_{mc}$;

S4, a magnetic flux density $b$ of the iron core can be derived from the magnetic flux $\dot{\Phi}$ and a cross-sectional area S of the iron core, then a magnetic permeability $\mu$ of the iron core can be obtained by a formula $R_{mc}=l/(\mu S)$, and next a magnetic field strength $\dot{H}$ corresponding to the magnetic flux density $\dot{B}$ can be obtained, wherein l is an average length of the magnetic circuit of the iron core; and the exciting voltage $\dot{U}_E$ is adjusted and the measurement process is repeated to obtain the reference B-H curve which only considers the nonlinear reluctance of the iron core, (2) the B-H curve considering an eddy current effect at any frequency of magnetic field can be derived from the reference B-H curve, wherein the specific process is as follows:

a reluctance $R_{mc}$ can be obtained from the reference B-H curve when any magnetic flux density $\|\dot{B}\|$ is known, the magnetic impedance $\dot{Z}_{mc}$ of the magnetic circuit can be obtained under the condition that the magnetic-inductance $L_{mc}$ is known corresponding to an eddy current reaction at any frequency, then the MMF $\dot{F}$ can be derived in this case by $\dot{F}=\dot{Z}_{mc}\cdot\dot{\Phi}$, next the magnetic field strength $\dot{H}$ can be obtained by $\dot{H}=\dot{F}/l$, and the B-H curve considering the eddy current effect can be drawn.

2. The measurement method for the B-H curve of magnetic material according to claim 1, wherein values of the magnetic-inductance $L_{mc}$ at the reference frequency $f_1$ and a frequency $f_2$ satisfy a relationship equation $$\frac{L_{mc\_1}}{L_{mc\_2}}=\sqrt{\frac{f_2}{f_1}},$$

and according to the relationship equation, the value of the magnetic-inductance $L_{mc}$ at any frequency can be obtained by the magnetic-inductance $L_{mc}$ at the reference frequency.

3. The measurement method for the B-H curve of magnetic material according to claim 1, wherein the magnetic-inductance $L_{mc}$ is equivalent to a lumped parameter representing the eddy current reaction in the iron core of the Epstein frame, the reluctance $R_{mc}$ is equivalent to a lumped parameter representing a nonlinear action of the iron core, and the vector model of the magnetic circuit of the iron core is $\dot{F}=(R_{mc}+j\omega L_{mc})\dot{\Phi}$, wherein j represents an imaginary unit.

4. The measurement method for the B-H curve of magnetic material according to claim 3, wherein virtual magnetic power $\dot{S}_{mc}$ based on the vector model of the magnetic circuit is obtained by the MMF $\dot{F}$ and the magnetic flux $\dot{\Phi}$, as follows:

$$\dot{S}_{mc}=\dot{\Phi}\cdot\dot{F}^*=\dot{\Phi}\cdot[R_{mc}\cdot\dot{\Phi}^*-j\omega L_{mc}\dot{\Phi}^*]=R_{mc}\|\dot{\Phi}\|^2-j\omega L_{mc}\|\dot{\Phi}\|^2.$$

5. The measurement method for the B-H curve of magnetic material according to claim 4, wherein the virtual magnetic power $\dot{S}_{mc}$ and electric power $\dot{S}_e$ are in a convertible relationship of $\dot{S}_e=j=\omega\dot{S}_{mc}=\omega^2 L_{mc}\|\dot{\Phi}\|^2+j\omega R_{mc}\|\dot{\Phi}\|^2$, wherein the real part is the active power input by using the excitation coil, and the imaginary part is reactive power input by using the excitation coil.

* * * * *